(12) United States Patent
Itoh

(10) Patent No.: US 9,147,645 B2
(45) Date of Patent: Sep. 29, 2015

(54) SEMICONDUCTOR DEVICE

(71) Applicant: SUMITOMO BAKELITE CO., LTD., Tokyo (JP)

(72) Inventor: Shingo Itoh, Tokyo (JP)

(73) Assignee: SUMITOMO BAKELITE CO., LTD., Tokyo (JP)

(*) Notice: Subject to any disclaimer, the term of this patent is extended or adjusted under 35 U.S.C. 154(b) by 0 days.

(21) Appl. No.: 14/374,143

(22) PCT Filed: Mar. 12, 2013

(86) PCT No.: PCT/JP2013/001592
§ 371 (c)(1),
(2) Date: Jul. 23, 2014

(87) PCT Pub. No.: WO2013/140746
PCT Pub. Date: Sep. 26, 2013

(65) Prior Publication Data
US 2015/0021752 A1 Jan. 22, 2015

(30) Foreign Application Priority Data
Mar. 23, 2012 (JP) .................. 2012-068100

(51) Int. Cl.
*H01L 23/495* (2006.01)
*H01L 23/00* (2006.01)
*H01L 23/31* (2006.01)

(52) U.S. Cl.
CPC ...... *H01L 23/49503* (2013.01); *H01L 23/3171* (2013.01); *H01L 23/4952* (2013.01);
(Continued)

(58) Field of Classification Search
CPC ......... H01L 24/44; H01L 24/46; H01L 24/47; H01L 24/45
USPC ...................................... 257/676
See application file for complete search history.

(56) References Cited

U.S. PATENT DOCUMENTS

| 2004/0245320 | A1 | 12/2004 | Fukagaya et al. |
| 2011/0089549 | A1* | 4/2011 | Zenbutsu et al. ............ 257/676 |
| 2012/0261807 | A1* | 10/2012 | Itoh et al. ................. 257/676 |

FOREIGN PATENT DOCUMENTS

| JP | 62-265729 A | 11/1987 |
| JP | 2004-64033 A | 2/2004 |

(Continued)

OTHER PUBLICATIONS

International Search Report, mailed May 7, 2013, issued in PCT/JP2013/001592.

*Primary Examiner* — Julio J Maldonado
*Assistant Examiner* — Hajar Kolahdouzan
(74) *Attorney, Agent, or Firm* — Birch, Stewart, Kolasch & Birch, LLP

(57) ABSTRACT

There is provided a semiconductor device having excellent moisture resistance and high temperature storage properties. The semiconductor device includes a lead frame that has a die pad and an inner lead, as a substrate, a semiconductor element that is mounted on the die pad, an electrode pad that is provided in the semiconductor element, a copper wire that connects the inner lead provided on the substrate and the electrode pad, and an encapsulant resin that encapsulates the semiconductor element and the copper wire. A region of the electrode pad disposed within a range of at least equal to or less than 3 μm from a junction surface with the copper wire in a depth direction includes a metal, which is less likely to be ionized than aluminum, as a main component, and a content of sulfur in the copper wire is equal to or more than 15 ppm and equal to or less than 100 ppm with respect to a total amount of the copper wire.

5 Claims, 1 Drawing Sheet

(52) U.S. Cl.
CPC ............... H01L24/45 (2013.01); *H01L 24/05* (2013.01); *H01L 24/48* (2013.01); *H01L 2224/02166* (2013.01); *H01L 2224/04042* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05669* (2013.01); *H01L 2224/32245* (2013.01); *H01L 2224/45015* (2013.01); *H01L 2224/45144* (2013.01); *H01L 2224/45147* (2013.01); *H01L 2224/48091* (2013.01); *H01L 2224/48227* (2013.01); *H01L 2224/48247* (2013.01); *H01L 2224/48463* (2013.01); *H01L 2224/48465* (2013.01); *H01L 2224/48839* (2013.01); *H01L 2224/48844* (2013.01); *H01L 2224/48847* (2013.01); *H01L 2224/48855* (2013.01); *H01L 2224/48864* (2013.01); *H01L 2224/48869* (2013.01); *H01L 2224/73265* (2013.01); *H01L 2924/01047* (2013.01)

(56) References Cited

FOREIGN PATENT DOCUMENTS

| | | |
|---|---|---|
| JP | 2009-59962 A | 3/2009 |
| JP | 2009-152561 A | 7/2009 |

* cited by examiner

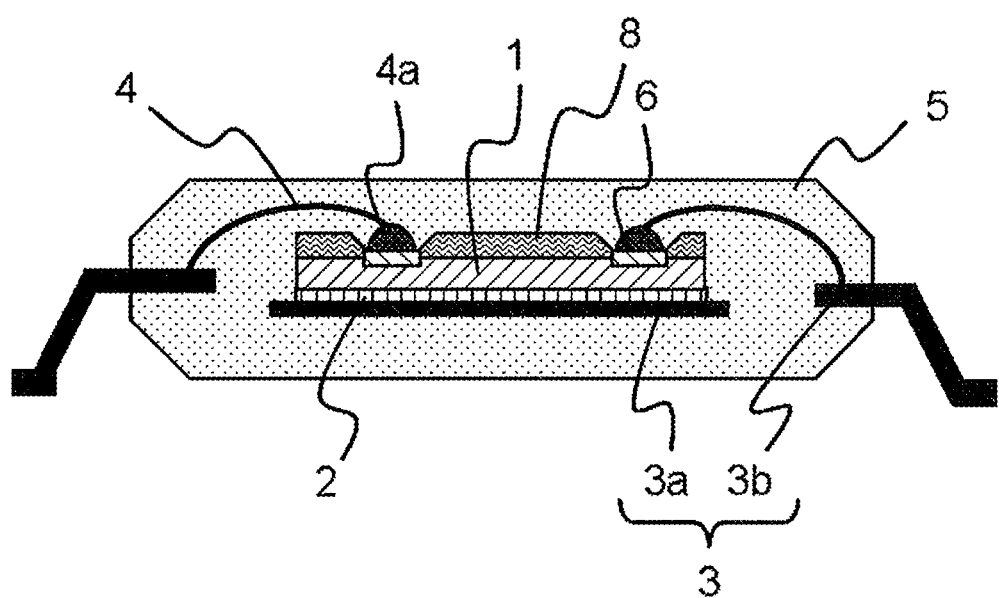

SEMICONDUCTOR DEVICE

TECHNICAL FIELD

The present invention relates to a semiconductor device.

BACKGROUND ART

In recent years, a copper wire has been proposed as a bonding wire in place of a gold wire.

In general, copper as a raw material for a copper wire is refined by removing impurities and is used. However, in such high purity copper, there is a problem that the copper becomes easily oxidized when the copper is processed into a wire, or after the copper is processed into a copper wire. Therefore, bonding using a copper wire is likely to cause a defect, and particularly, the performance of the wire is likely to be degraded when the wire is stored at a high temperature.

As a technique using copper wire bonding, for example, there is disclosed a technique in Patent Document 1.

In Patent Document 1, there is disclosed a semiconductor device in which a copper-aluminum intermetallic compound is formed at a junction interface between a wire and an electrode in a semiconductor device in which an electrode and a lead of a semiconductor element are connected by a copper bonding wire, and led out. According to Patent Document 1, since a copper ball comes into close contact with the electrode by forming a $CuAl_2$ layer at a junction interface between the copper ball and the aluminum electrode, the reliability is improved from the viewpoint of corrosion resistance.

RELATED DOCUMENT

Patent Document

[Patent Document 1] Japanese Unexamined Patent Publication No. S62-265729

DISCLOSURE OF THE INVENTION

However, when a junction between the copper wire and the aluminum pad is further subjected to heat treatment, Cu diffuses from the copper wire to the $CuAl_2$ layer, and an alloy layer having a higher Cu composition ratio than that of $CuAl_2$ is formed. According to the findings of the present inventors, it is apparent that the alloy layer having a higher Cu composition ratio than that of $CuAl_2$ easily suffers from corrosion caused by halogen and disconnection easily occurs.

The present invention has been made in view of the above described circumstances, and an object of the present invention is to improve moisture resistance and high temperature storage properties by improving connection reliability between the copper wire and the electrode pad.

According to the present invention, there is provided a semiconductor device including: a semiconductor element that is mounted on a substrate; an electrode pad that is provided in the semiconductor element; a copper wire that connects a connection terminal provided on the substrate and the electrode pad; and an encapsulant resin that encapsulates the semiconductor element and the copper wire, in which a region of the electrode pad disposed within a range of at least equal to or less than 3 μm from a junction surface with the copper wire in a depth direction includes a metal, which is less likely to be ionized than aluminum, as a main component, and a content of sulfur in the copper wire is equal to or more than 15 ppm and equal to or less than 100 ppm with respect to a total amount of the copper wire.

According to the present invention, there is provided a semiconductor device with excellent moisture resistance and high temperature storage properties by improving connection reliability between a copper wire and an electrode pad.

BRIEF DESCRIPTION OF THE DRAWINGS

FIG. 1 is a cross-sectional view schematically illustrating a semiconductor device according to an embodiment.

DESCRIPTION OF EMBODIMENTS

Hereinafter, embodiments of the present invention will be described with reference to the drawings. Note that, in all of the drawings, the same constituents are denoted by the same reference numerals, and thus, the redundant description thereof will not be repeated appropriately.

FIG. 1 is a cross-sectional view schematically illustrating a semiconductor device 10 according to an embodiment. The semiconductor device 10 includes a lead frame 3 that has a die pad 3a and an inner lead 3b, as a substrate, a semiconductor element 1 that is mounted on the die pad 3a, an electrode pad 6 that is provided in the semiconductor element 1, a copper wire 4 that connects a connection terminal (inner lead 3b) provided on the substrate and the electrode pad 6, and an encapsulant resin 5 that encapsulates the semiconductor element 1 and the copper wire 4.

The semiconductor element 1 is not particularly limited and examples thereof include an integrated circuit, a large-scale integrated circuit, and a solid-state image-sensing element.

The lead frame 3 is not particularly limited and a circuit substrate may be used in place of the lead frame 3. Specifically, lead frames or circuit substrates that are used in semiconductor devices of the related art can be used, including a dual inline package (DIP), a plastic leaded chip carrier (PLCC), a quad flat package (QFP), a low profile quad flat package (LQFP), a small outline j-lead package (SOJ), a thin small outline package (TSOP), a thin quad flat package (TQFP), a tape carrier package (TCP), a ball grid array (BGA), a chip size package (CSP), a quad flat non-leaded package (QFN), a small outline non-leaded package (SON), a lead frame BGA (LF-BGA), and a mold array package BGA (MAP-BGA).

The semiconductor element 1 may be a stack of plural semiconductor elements. In this case, a semiconductor element of a first layer is bonded to the die pad 3a through a cured body 2 of a die-bonding material such as a film adhesive and a thermosetting adhesive. Semiconductor elements of second and further layers can be sequentially stacked with an insulating film adhesive or the like. The electrode pad 6 is formed at appropriate places of each layer in advance in a pre-process.

In the present invention, a region of the electrode pad 6 away from a junction surface with the copper wire 4 in the depth direction by a predetermined distance only has to include a metal, which is less likely to be ionized than Al, as a main component. Here, the concept of the "junction surface" in the present invention does not include an oxide film that is spontaneously formed and a protective film that is intentionally formed on the surface of the electrode pad after the electrode pad is formed and means a surface of an electrode pad that is formed for the purpose of substantial electrical connection with the wire at the time of bonding. In addition, the "depth direction" of the electrode pad 6 refers to a direction away from the copper wire 4 in a direction orthogonal to the junction surface between the copper wire 4 and the electrode pad 6.

The expression "a range of at least equal to or less than 3 µm from a junction surface with the copper wire 4 in a depth direction" means that when the thickness of the electrode pad 6 is less than 3 µm, the range refers to the entire electrode pad 6, and when the thickness of the electrode pad 6 is equal to or more than 3 µm, the region refers to a region at a depth of up to 3 µm from the junction surface with the copper wire 4. In addition, the surface of the electrode pad 6 may include a metal, which is less likely to be ionized than Al, as a main component. In the electrode pad 6, a region is provided at a depth of at least equal to or less than 3 µm, and preferably equal to or more than 1 nm and equal to less than 3 µm from the junction surface with the copper wire 4 in the depth direction, and includes a metal, which is less likely to be ionized than Al, as a main component. However, it is more preferable that the entire electrode pad 6 include a metal, which is less likely to be ionized than Al, as a main component.

In the present invention, the expression "includes a metal, which is less likely to be ionized than Al, as a main component" means that the content of the "metal which is less likely to be ionized than Al" is preferably equal to or more than 90% by mass, and more preferably equal to or more than 95% by mass in a predetermined region of the electrode pad 6. Specifically, the content of the metal which is less likely to be ionized than Al in the electrode pad 6 is preferably equal to or more than 90% by mass, more preferably equal to or more than 98% by mass, and still more preferably equal to or more than 99.5% by mass with respect to the total amount of the electrode pad 6.

The metal which is less likely to be ionized than Al is preferably selected from the group consisting of nickel, gold, palladium, silver, copper, and platinum, and more preferably selected from the group consisting of gold, palladium, and copper. Among these, one or two or more metals may be selected.

For example, the electrode pad 6 can be formed by forming a typical titanium-based barrier layer and then, applying a metal which is less likely to be ionized than Al by using methods of forming an Al pad for a semiconductor element of the related art, such as deposition, sputtering, electro plating, and electroless plating.

As components other than the metal which is less likely to be ionized than Al in the electrode pad 6, impurities which are unavoidably mixed in deposition, sputtering, electro plating, electroless plating, and the like adopted in the process of forming the pad are acceptable.

In the electrode pad 6 of the present invention, it is preferable that the region disposed at a depth of at least equal to or less than 3 µm, and preferably equal to or more than 1 nm and equal to less than 3 µm from the junction surface with the copper wire 4 in the depth direction include the metal which is less likely to be ionized than Al within the preferable range as described above. However, the electrode pad 6 may be formed of a single layer of metal which is less likely to be ionized than Al, or a metal layer formed of a single layer or plural layers coated with the metal which is less likely to be ionized than Al. For example, the electrode pad 6 may be an Al pad which is coated with the metal which is less likely to be ionized than Al. Here, the "coating" may be continuous or partial.

The expression "a region of the electrode pad 6 within a range of at least equal to or less than 3 µm from a junction surface with the copper wire 4 in a depth direction includes a metal, which is less likely to be ionized than Al" as a main component means that at least a part of the region of the electrode pad 6 includes a metal, which is less likely to be ionized than aluminum, as a main component, and the region is not limited to the entire region.

The copper wire 4 is used to electrically connect the lead frame 3 and the semiconductor element 1 that is mounted on the die pad 3a of the lead frame 3. On the surface of the copper wire 4, an oxide film is formed spontaneously or unavoidably in processes. In the present invention, the copper wire 4 also includes the wire described above that has the oxide film on the surface thereof.

The diameter of the copper wire 4 is preferably equal to or less than 30 µm, and more preferably equal to or less than 25 µm and equal to or more than 15 µm. Within this range, the ball shape at the tip of the copper wire is stabilized, so that connection reliability can be improved at the junction. In addition, the frequency of wire displacement can be reduced by the hardness of the copper wire itself.

The content of copper in the copper wire 4 is preferably 99.9% by mass to 100% by mass, and more preferably 99.99% by mass to 99.999% by mass with respect to the total amount of the copper wire 4 excluding sulfur and chlorine.

The copper wire 4 can be provided with further improved bonding strength by doping copper as a core wire with Ba, Ca, Sr, Be, Al, or a rare-earth metal in an amount of 0.001% by mass to 0.1% by mass.

A copper ball 4a is formed at the tip of the copper wire 4 in the junction between the copper wire 4 and the electrode pad 6.

The content of sulfur in the copper wire 4 is preferably equal to or more than 15 ppm and more preferably equal to or more than 20 ppm with respect to the total amount of the copper wire 4 from the viewpoint of performing satisfactory wire bonding by preventing oxidization while a complicated refining process of copper as a raw material is not required. On the other hand, from the viewpoint of obtaining practical and satisfactory connectability by preventing corrosion of the junction surface, the content of sulfur is preferably equal to or less than 100 ppm, and more preferably equal to or less than 80 ppm with respect to the total amount of the copper wire 4. When the content of sulfur is within a range of equal to or more than 15 ppm and equal to or less than 100 ppm, and more preferably equal to or more than 20 ppm and equal to or less than 80 ppm, the high temperature storage properties of the semiconductor device can be improved.

The content of chlorine in the copper wire 4 is preferably equal to or more than 5 ppm, and more preferably equal to or more than 10 ppm with respect to the total amount of the copper wire 4 from the viewpoint of performing satisfactory wire bonding by preventing oxidization while not requiring a complicated refining process of copper as a raw material. On the other hand, from the viewpoint of obtaining practical and satisfactory connectability by preventing corrosion of the junction surface, the content of chlorine is preferably equal to or less than 100 ppm, and more preferably equal to or less than 80 ppm with respect to the total amount of the copper wire 4. When the content of chlorine is within a range of equal to or more than 5 ppm and equal to or less than 100 ppm, and more preferably equal to or more than 10 ppm and equal to or less than 80 ppm, the high temperature storage properties of the semiconductor device can be improved.

The encapsulant resin 5 is preferably a cured body of a curable resin and specifically, more preferably a resin obtained by curing an epoxy resin composition containing (A) an epoxy resin and (B) a curing agent.

In the present invention, since the junction surface between the electrode pad 6 and the copper wire 4 is formed of a metal which is less likely to be ionized than aluminum, connection reliability can be improved regardless of the density of chloride (Cl) ions in the encapsulant resin 5. However, the density of Cl ions in the encapsulant resin 5 is within a range of, preferably equal to or less than 500 ppm, more preferably 10 ppm to 300 ppm, and still more preferably 20 ppm to 250 ppm.

For example, the density of Cl ions in the encapsulant resin 5 can be quantified by finely pulverizing the encapsulant resin 5 which is a cured object, adding 50 ml of distilled water to 5 g of the pulverized product, performing a treatment at 125° C. for 20 hours, and subjecting the supernatant liquid to ion chromatography after the treatment.

Further, as another example of quantifying the density of Cl ions in the encapsulant resin 5, a product, obtained by forming the epoxy resin composition before the encapsulant resin 5 is formed into a test piece having a size of 50 mmφ×3 mm by molding the resin using a low-pressure transfer molding machine under conditions of a mold temperature of 175° C., an injection pressure of 7.5 MPa, and a curing time of 2 minutes, and post-curing the resin at 175° C. for 8 hours, is finely pulverized, and then, measured in the same manner.

(A) The epoxy resin includes monomers, oligomers, and polymers having two or more epoxy groups in one molecule. The molecular weight and molecular structure thereof are not particularly limited. Examples thereof include bisphenol epoxy resins such as biphenyl epoxy resins, bisphenol A epoxy resins, bisphenol F epoxy resins, and tetramethyl bisphenol F epoxy resins, and stilbene epoxy resins; novolak epoxy resins such as phenol novolak epoxy resins and cresol novolak epoxy resins; polyfunctional epoxy resins such as triphenolmethane epoxy resins and alkyl-modified triphenolmethane epoxy resins; aralkyl epoxy resins such as phenolaralkyl epoxy resins having a phenylene structure, and phenolaralkyl epoxy resins having a biphenylene structure; naphthol epoxy resins such as dihydroxynaphthalene epoxy resins, and an epoxy resin that is obtained by glycidyl etherifying a dihydroxynaphthalene dimer; epoxy resins having a triazine nucleus such as triglycidyl isocyanurate and monoallyl diglycidyl isocyanurate; and phenol epoxy resins modified with bridged cyclic hydrocarbon compounds such as phenol epoxy resin modified with dicyclopentadiene. These may be used singly or in combination of two or more.

Among these, epoxy resins which exhibit crystallinity are preferable. Examples of such epoxy resins include bisphenol epoxy resins such as biphenyl epoxy resins, bisphenol A epoxy resins, bisphenol F epoxy resins, and tetramethyl bisphenol F epoxy resins, and stilbene epoxy resins.

As the epoxy resin (A), at least one epoxy resin selected from the group consisting of an epoxy resin represented by the following formula (1), an epoxy resin represented by the following formula (2), and an epoxy resin represented by the following formula (3) can be preferably used.

[Chem. 1]

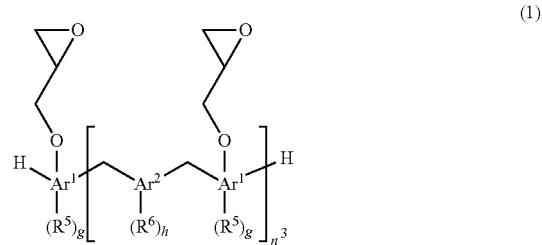

(1)

[In the formula (1), $Ar^1$ represents a phenylene group or a naphthylene group, each binding position of the glycidyl ether groups may be any one of α-position and β-position when $Ar^1$ is the naphthylene group, $Ar^2$ represents any one of a phenylene group, a biphenylene group, and a naphthylene group, $R^5$ and $R^6$ each independently represents a hydrocarbon group having 1 to 10 carbon atoms, g is an integer of 0 to 5, h is an integer of 0 to 8, $n^3$ represents polymerization degree, and the average value of $n^3$ is 1 to 3.]

[Chem. 2]

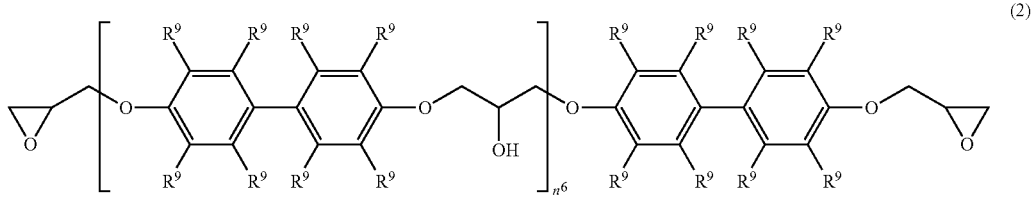

(2)

[In the formula (2), a plurality of $R^9$ each independently represents a hydrogen atom or a hydrocarbon group having 1 to 4 carbon atoms, $n^5$ represents polymerization degree, and the average value of $n^5$ is 0 to 4.]

[Chem. 3]

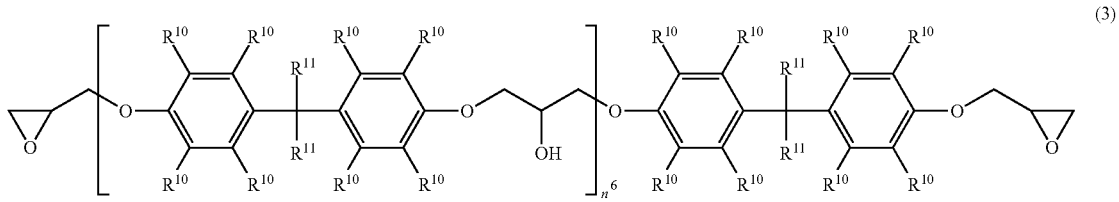

[In the formula (3), a plurality of $R^{10}$ and $R^{11}$ each independently represents a hydrogen atom or a hydrocarbon group having 1 to 4 carbon 5 atoms, $n^6$ represents polymerization degree, and the average value of $n^6$ is 0 to 4.]

The content of (A) the epoxy resin is preferably equal to or more than 3% by mass, more preferably equal to or more than 5% by mass, and still more preferably equal to or more than 8% by mass with respect to the total amount of the epoxy resin composition. Accordingly, there is less risk of the occurrence of wire breakage caused by viscosity increase. Further, the content of the epoxy resin (A) is preferably equal to or less than 18% by mass, more preferably equal to or less than 13% by mass, and still more preferably equal to or less than 11% by mass, with respect to the total amount of the epoxy resin composition. Accordingly, there is less risk of the occurrence of deterioration in the moisture resistance reliability caused by a water absorption ratio increase.

For example, (B) the curing agent can be roughly classified into three types: a polyaddition type curing agent; a catalyst type curing agent; and a condensation type curing agent.

Examples of the polyaddition type curing agent include aliphatic polyamines such as diethylenetriamine (DETA), triethylenetetramine (TETA), and meta-xylylene diamine (MXDA); and aromatic polyamines such as diaminodiphenyl methane (DDM), m-phenylenediamine (MPDA), and diaminodiphenylsulfone (DDS); as well as polyamine compounds such as dicyandiamide (DICY), and organic acid dihydrazide; acid anhydrides including alicyclic acid anhydrides such as hexahydrophthalic anhydride (HHPA) and methyltetrahydrophthalic anhydride (MTHPA), and aromatic acid anhydrides such as trimellitic anhydride (TMA), pyromellitic dianhydride (PMDA), and benzophenone-tetracarboxylic acid (BTDA); phenol resin-based curing agents such as novolac type phenol resins and polyvinylphenol; polymercaptan compounds such as polysulfide, thioester, and thioether; isocyanate compounds such as isocyanate prepolymers, and blocked isocyanates; and organic acids such as polyester resins containing a carboxylic acid.

Examples of the catalyst type curing agent include tertiary amine compounds such as benzyldimethylamine (BDMA), and 2,4,6-trisdimethylaminomethylphenol (DMP-30); imidazole compounds such as 2-methylimidazole, and 2-ethyl-4-methylimidazole (EMI24); and Lewis acids such as BF3 complexes.

Examples of the condensation type curing agent include resol phenol resins; urea resins such as urea resins containing a methylol group; and melamine resins such as melamine resins containing a methylol group.

Among them, the phenol resin-based curing agents are preferred from the viewpoint of the balance among flame resistance, moisture resistance, electric properties, curability, storage stability and the like. Examples of the phenol resin-based curing agent include monomers, oligomers, and polymers having two or more phenolic hydroxyl groups in one molecule, and the molecular weight and molecular structure thereof are particularly not limited. Examples thereof include novolac type epoxy resins such as phenol novolac resins, cresol novolac resins, and bisphenol novolac resins; polyfunctional phenol resins such as triphenol methane type phenol resins; modified phenol resins such as terpene-modified phenol resins and dicyclopentadiene-modified phenol resins; aralkyl type resins such as phenol aralkyl resins having a phenylene skeleton and/or a biphenylene skeleton and naphthol aralkyl resins having a phenylene skeleton and/or a biphenylene skeleton; and bisphenol compounds such as bisphenol A and bisphenol F. These may be used singly or in combination of two or more.

As (B) the curing agent, at least one curing agent selected from the group consisting of a compound represented by the following formula (4) can be preferably used.

[Chem. 4]

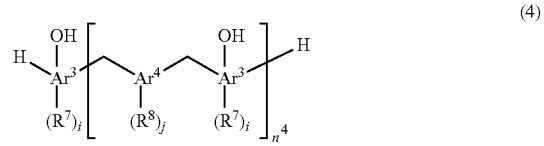

[In the formula (4), $Ar^3$ represents a phenylene group or a naphthylene group, each binding position of the hydroxyl groups may be any one of α-position and β-position when $Ar^3$ is the naphthylene group, $Ar^4$ represents any one of a phenylene group, a biphenylene group, and a naphthylene group, $R^7$ and $R^8$ each independently represents a hydrocarbon group having 1 to 10 carbon atoms, i is an integer of 0 to 5, j is an integer of 0 to 8, $n^4$ represents polymerization degree, and the average value of $n^4$ is 1 to 3.]

The content of (B) the curing agent is preferably equal to or more than 2% by mass, more preferably equal to or more than 3% by mass, and still more preferably equal to or more than 6% by mass in the epoxy resin composition. Thus, it is possible to obtain sufficient fluidity. In addition, the content of (B) the curing agent is preferably equal to or less than 15% by mass, more preferably equal to or less than 11% by mass, and still more preferably equal to or less than 8% by mass in the epoxy resin composition. Thus, there is less concern for deterioration in the moisture resistance reliability caused by a water absorption ratio increase occurring.

Further, when phenol resin-based curing agent is used as (B) the curing agent, the blend ratio of the epoxy resin to the phenol resin-based curing agent is preferably an equivalent ratio of the number of the epoxy groups (EP) of the overall epoxy resin to the number of the phenolic hydroxyl groups (OH) of the overall phenol resin-based curing agent, (EP)/(OH), of 0.8 to 1.3. When the equivalent ratio is within the above range, there is less concern for deterioration in curability of the epoxy resin composition or deterioration in physical properties of the cured resin product occurring.

In addition, the epoxy resin composition forming the encapsulant resin 5 may contain (C) a filler, and (D) a neutralizing agent, and (E) a curing accelerator, as required.

As such (C) a filler, materials generally used in epoxy resin compositions for encapsulating semiconductors can be used. Examples thereof include inorganic fillers such as fused spherical-silica, pulverized fused silica, crystalline silica, talc, alumina, titanium white, and silicon nitride, and organic fillers such as organosilicone powder, and polyethylene powder. Among these, fused spherical silica is particularly preferable. These fillers may be used singly or in combination of two or more. In addition, the shape of (C) the filler is preferably as close to spherical as possible and the particle diameter distribution thereof is preferably broad, whereby an increase in the melt viscosity of the epoxy resin composition is prevented and the content of the filler is increased. The filler may be subjected to surface treatment with a coupling agent. Further, as required, the filler may be subjected to a treatment with an epoxy resin or a phenol resin in advance. Examples of the treatment method include a method of mixing in a solvent and then removing the solvent, and a method of directly adding to the filler and then mixing with a blending machine.

The content of (C) the filler is preferably equal to or more than 65% by mass, more preferably equal to or more than 75% by mass, and still more preferably equal to or more than 80% by mass with respect to the total amount of the epoxy resin composition from the viewpoint of the filling properties of the epoxy resin composition and the reliability of the semiconductor device. Since low hygroscopicity and low thermal expandability can thus be obtained, there is less concern for moisture resistance reliability being insufficient. In addition, considering moldability, the content of (C) the filler is preferably equal to or less than 93% by mass, more preferably equal to or less than 91% by mass, and still more preferably equal to or less than 86% by mass, with respect to the total amount of the epoxy resin composition. Thus, there is less concern for deterioration in fluidity, defective filling upon molding, and the like, and inconveniences such as wire displacement in semiconductor devices caused by viscosity increase.

As (D) the neutralizing agent, those that neutralize acid corrosive gas generated from heating of the encapsulant resin 5 that is an epoxy resin composition or a cured body thereof can be used. Accordingly, the corrosion (oxidation deterioration) of the junction between the copper wire 4 and the electrode pad 6 of the semiconductor element 1 can be prevented. Specifically, as (D) the neutralizing agent, a basic metal salt, particularly, at least one compound selected from the group consisting of a compound containing a calcium element, a compound containing an aluminum element, and a compound containing a magnesium element can be used.

Examples of the compound containing a calcium element include calcium carbonate, calcium borate, and calcium metasilicate. Among these, calcium carbonate is preferable from the viewpoint of the content of impurities, the water resistance, and the low water absorption ratio, and precipitated calcium carbonate synthesized by a carbon dioxide gas reaction method is more preferable.

Examples of the compound containing an aluminum element include aluminum hydroxides, and boehmite. Among these, aluminum hydroxides are preferable and among the aluminum hydroxides, a low-soda aluminum hydroxide synthesized by a two-step Bayer process is more preferable.

Examples of the compound containing a magnesium element include hydrotalcite, magnesium oxide, and magnesium carbonate. Among them, from the viewpoint of the content of impurities and the low water absorption ratio, a hydrotalcite represented by the following formula (5) is preferable.

$$M_a Al_b (OH)_{2a+3b-2c} (CO_3)_c \cdot mH_2O \qquad (5)$$

[In the formula (5), M represents a metal element containing at least Mg, a, b, and c are numbers satisfying conditions of $2 \leq a \leq 8$, $1 \leq b \leq 3$, and $0.5 \leq c \leq 2$, respectively, and m is an integer of 0 or more.]

Specific examples of the hydrotalcite include $Mg_6Al_2(OH)_{16}(CO_3) \cdot mH_2O$, $Mg_3ZnAl_2(OH)_{12}(CO_3) \cdot mH_2O$, and $Mg_{4.3}Al_2(OH)_{12.6}(CO_3) \cdot mH_2O$.

The content of (D) the neutralizing agent is preferably 0.01% by mass to 10% by mass with respect to the total amount of the epoxy resin composition. When the content of (D) the neutralizing agent is set to be equal to or more than 0.01% by mass, the addition effect of the neutralizing agent can be sufficiently exhibited and the corrosion (oxidation deterioration) of the junction between the copper wire 4 and the electrode pad 6 is more reliably prevented. Thus, the high temperature storage properties of the semiconductor device can be improved. In addition, when the content of (D) the neutralizing agent is set to be equal to or less than 10% by mass, the moisture absorption ratio can be decreased, and thus, solder crack resistance is likely to be improved. Particularly, when calcium carbonate or hydrotalcite is used as the corrosion inhibitor, from the same viewpoint as above, the content thereof is preferably 0.05% by mass to 2% by mass with respect to the total amount of the epoxy resin composition.

(E) The curing accelerator may be any of those that accelerate the crosslinking reaction of the epoxy group of the epoxy resin with the curing agent (for example, the phenolic hydroxyl group of the phenol resin-based curing agent), and those generally used for epoxy resin compositions for encapsulating semiconductors can be used. Examples thereof include diazabicycloalkenes such as 1,8-diazabicyclo(5,4,0)undecene-7 and derivatives thereof; organic phosphines such as triphenylphosphine and methyldiphenylphosphine; imidazole compounds such as 2-methylimidazole; tetra-substituted phosphonium tetra-substituted borates such as tetraphenylphosphonium tetraphenylborate; the adducts of a phosphine compound with a quinone compound; and the like. These may be used singly or in combination of two or more.

The content of (E) the curing accelerator is preferably equal to or more than 0.05% by mass, and more preferably equal to or more than 0.1% by mass with respect to the total amount of the epoxy resin composition. Thus, there is less concern for deterioration in curability occurring. Moreover, the content of (E) the curing accelerator is preferably equal to or less than 1% by mass, and more preferably equal to or less than 0.5% by mass with respect to the total amount of the epoxy resin composition. Thus, there is less concern for deterioration in fluidity occurring.

The epoxy resin composition for forming the encapsulant resin 5 may be further blended appropriately with various additives, as required. Examples of the additives include aluminum corrosion inhibitors such as zirconium hydroxide; inorganic ion exchangers such as bismuth oxide hydrate; coupling agents such as γ-glycidoxypropyltrimethoxysilane, 3-mercaptopropyltrimethoxysilane, 3-aminopropyltrimethoxysilane, and epoxysilane; coloring agents such as carbon black and colcothar; low-stress components such as silicone rubber; natural waxes such as carnauba wax; synthetic waxes; higher fatty acids such as zinc stearate, and metal salts thereof; mold releasing agents such as paraffin; flame retardants such as aluminum hydroxide, magnesium hydroxide, zinc borate, zinc molybdate, and phosphazene; and antioxidants.

The epoxy resin composition for forming the encapsulant resin 5 can be prepared, for example, by mixing each of the aforementioned components with a mixer or the like at 15° C. to 28° C., or after that, by melt-kneading the resultant using a kneading machine such as a roll, a kneader, or a extruder, and pulverizing the resultant after cooling, and in addition, appropriately adjusting the degree of dispersion, fluidity, and the like, as required.

Next, an example of a method of manufacturing the semiconductor device 10 according to the embodiment will be described.

First, the electrode pad 6 of the present invention is formed up to an underlayer by a known process for manufacturing a semiconductor (mainly pre-process), and the electrode pad 6 of the present invention is prepared by applying a metal which is less likely to be ionized than Al by using methods of forming an Al pad for a semiconductor element of the related art, such as deposition, sputtering, and electroless plating. Then, processes after the process of forming the electrode pad are performed. A protective layer 8 in the drawing is formed of an insulating film of SiN or the like. Next, the semiconductor element 1 including the electrode pad 6 is disposed over the die pad 3a of the lead frame 3 further by a known post-process, and the electrode pad 6 and the inner lead 3b are wire-bonded with the copper wire 4.

The bonding is performed in the following order. First, a copper ball 4a having a predetermined diameter is formed at the tip of the copper wire 4. Then, the copper ball 4a is lowered substantially orthogonal to the upper surface of the electrode pad 6 while the copper ball 4a is brought into contact with the electrode pad 6, and ultrasonic vibration is applied thereto.

Therefore, the bottom surface of the copper ball 4a is brought into contact with the electrode pad 6 to form a junction surface.

The inner lead 3b of the lead frame 3 and the semiconductor element 1 may be bonded by wire reverse bonding. In the reverse bonding, first, the ball formed at the tip of the copper wire 4 is bonded to the electrode pad 6 of the semiconductor element 1, and the copper wire 4 is cut so as to form a bump for stitch-bonding. Then, the ball formed at the tip of the wire is bonded to the metal plated inner lead 3b of the lead frame 3 so as to be stitch-bonded to the bump of the semiconductor element. In the reverse bonding, the height of the wire over the semiconductor element 1 becomes lower as compared with forward bonding, so that the height of the junction of the semiconductor element 1 can be made to be low.

Next, the semiconductor element 1, the copper wire 4, and the inner lead 3b are encapsulated by curing and molding a curable resin (for example, the above-mentioned epoxy resin composition) by molding methods of the related art such as transfer molding, compression molding, and injection molding, and post-curing is performed thereon at a temperature of about 80° C. to 200° C. for about 10 minutes to 24 hours. The post-curing is preferably performed at 150° C. to 200° C. for 2 hours to 16 hours. Thereafter, the semiconductor element 1 encapsulated with the encapsulant resin 5 can be mounted on an electronic instrument.

According to the semiconductor device thus manufactured, in the manufacturing process or while the semiconductor device is used, even when heat is applied to the junction between the copper wire 4 and the electrode pad 6, Cu does not diffuse from the copper ball 4a, and thus, a CuAl alloy layer that is highly likely to be corroded is not formed at the junction between the copper wire 4 and the electrode pad 6. In addition, since the content of sulfur in the copper wire 4 is equal to or more than 15 ppm and equal to or less than 100 ppm with respect to the total amount of the copper wire 4, oxidization and corrosion are prevented. Therefore, the semiconductor device having excellent moisture resistance and high temperature storage properties is provided.

Embodiments of the present invention are described above with reference to drawings. These are examples of the present invention. Various configurations besides the above may also be adopted.

Example 1

Hereinafter, the present invention will be described in detail based on examples and comparative examples, but the present invention is not limited to the following examples.

Preparation Examples 1 to 4

Each component shown in Table 1 was mixed with a mixer at 15° C. to 28° C., and then, rolled and kneaded at 70° C. to 100° C. After cooling, the resultant was pulverized to obtain an epoxy resin composition. Here, the detail of each component in Table 1 is as follows. Further, the unit in Table 1 is % by mass.

<(A) Epoxy Resin>

EP-BA: NC3000P, manufactured by Nippon Kayaku Co., Ltd., epoxy equivalent: 276, Cl ion density: 280 ppm EP-BA 2: NC3000P (highly chlorinated), manufactured by Nippon Kayaku Co., Ltd., epoxy equivalent: 275, Cl ion density: 6680 ppm <(B) Curing Agent>

HD-BA: MEH-7851SS, manufactured by MEIWA PLASTIC INDUSTRIES, LTD., hydroxyl group equivalent: 203

<(C) Filler>

Fused spherical silica: FB-820, manufactured by DENKI KAGAKU KOGYO KABUSHIKI KAISHA, average particle diameter: 26.5 μm, containing equal to or less than 1% by mass of particles having a diameter equal to or more than 105 μm <(D) Neutralizing Agent>

Hydrotalcite: DHT-4A (registered trademark) (Hydrotalcite in which a is 4.3, b is 2, and c is 1 in the above formula (5)), manufactured by Kyowa Chemical Industry Co., Ltd.

<(E) Curing Accelerator>

Triphenyl phosphine (TPP), manufactured by HOKKO CHEMICAL INDUSTRY CO., LTD.

<Other Components>

Coupling agent: epoxysilane

Coloring agent: carbon black

Mold releasing agent: carnauba wax

TABLE 1

| Component name | Item | Preparation Example 1 | Preparation Example 2 | Preparation Example 3 | Preparation Example 4 |
|---|---|---|---|---|---|
| Epoxy resin composition | (A) Epoxy resin | EP-BA | 16.65 | 8.65 | 4.65 | |
| | | EP-BA2 | | 8.00 | 12.00 | 16.65 |
| | (B) Curing agent | HD-BA | 12.25 | 12.25 | 12.25 | 12.25 |
| | (C) Filler | Silica | 69.90 | 69.90 | 69.90 | 69.90 |
| | (D) Neutralizing agent | Hydrotalcite | 0.10 | 0.10 | 0.10 | 0.10 |
| | (E) Curing accelerator | Triphenyl phosphine | 0.20 | 0.20 | 0.20 | 0.20 |
| | Other components | Carbon black | 0.30 | 0.30 | 0.30 | 0.30 |
| | | Epoxysilane | 0.20 | 0.20 | 0.20 | 0.20 |
| | | Carnauba wax | 0.40 | 0.40 | 0.40 | 0.40 |
| | Total | | 100.00 | 100.00 | 100.00 | 100.00 |
| Spiral flow (cm) | | | 183 | 206 | 231 | 256 |
| Gel time (sec) | | | 38 | 41 | 48 | 55 |
| Cl ion density (ppm) | | | 18 | 143 | 201 | 256 |

The physical properties of the epoxy resin compositions obtained in Preparation Examples 1 to 4 were measured by the following methods. The results are shown in Table 1.

<Spiral Flow (SF)>

Using a low-pressure transfer molding machine ("KTS-15", manufactured by Kohtaki Precision Machine Co., Ltd.), each of the epoxy resin compositions of Preparation Examples 1 to 4 was injected into a mold for spiral flow measurement in accordance with EMMI-1-66 so as to measure a flow length (unit: cm) under conditions of a mold temperature of 175° C., an injection pressure of 6.9 MPa, and a curing time of 120 seconds.

<Gel Time (GT)>

Each of the epoxy resin compositions of Preparation Examples 1 to 4 was fused on a heat plate heated to 175° C., and then, the time (second) that was required until the epoxy resin composition was cured was measured while the epoxy resin composition was kneaded with a spatula.

<Chlorine Ion (Cl) Density Measurement>

Using a low-pressure transfer molding machine ("KTS-15", manufactured by Kohtaki Precision Machine Co., Ltd.), a test piece having a size of 50 mm$\phi$×3 mm was molded under conditions of a mold temperature of 175° C., an injection pressure of 7.5 MPa, and a curing time of 2 minutes. The test piece was finely pulverized after post-cure conducted at 175° C. for 8 hours, and 50 mL of distilled water was added to 5 g of the pulverized product. The resultant was placed in a Teflon (registered trademark)-lined vessel and was subjected to a treatment at 125° C. for 20 hours. After the process, the supernatant liquid was subjected to ion chromatography to quantify Cl ions.

Examples 1 to 8 and Comparative Examples 1 to 3

A test element group (TEG) chip (3.5 mm×3.5 mm) including electrode pads shown in Table 2 was bonded to a die pad of a 352-pin BGA (a substrate having a thickness of 0.56 mm and being a bismaleimide triazine resin/glass cloth substrate, and a package having a size of 30 mm×30 mm and a thickness of 1.17 mm), and the electrode pads of the TEG chip and the electrode pads of the substrate were wire-bonded with a copper wire a (having a copper purity of 99.99% by mass and a diameter of 25 μm) at a wire pitch of 80 μm in a daisy-chain connection. These were encapsulated with any of the epoxy resin compositions of Preparation Examples 1 to 4 shown in Tables 2, and molded with a low-pressure transfer molding machine ("Y Series", manufactured by TOWA Corp.) under conditions of a mold temperature of 175° C., an injection pressure of 6.9 MPa, and a curing time of 2 minutes. Thus, 352-pin BGA packages were prepared. The packages were post-cured under conditions of 175° C. and 4 hours so as to obtain semiconductor devices.

In Table 2, the detail of the electrode pad is as follows.

Au: gold pad (thickness: 1 μm) having an Au purity of 99.9% by mass

Cu: copper pad (thickness: 1 μm) having a Cu purity of 99.9% by mass

Al: aluminum pad (thickness: 1 μm) having an Al purity of 99.9% by mass

The detail of the copper wire a (having a Cu purity of 99.99% and a diameter of 25 μm) is as follows.

Copper wire a

Sulfur density (ppm): 19 ppm

Chlorine density (ppm): 15 ppm

Comparative Example 4

A semiconductor device was obtained in the same manner as in Example 1 except that the following copper wire b was used instead of the copper wire a.

Copper wire b

Sulfur density (ppm): less than 1 ppm

Chlorine density (ppm): less than 1 ppm

The densities of sulfur and chlorine in the copper wire were measured by glow discharge mass spectrometric analysis.

<TEM Analysis>

Each of the semiconductor devices of Examples 1 to 8 and Comparative Examples 1 to 4 was heated at 175° C. for 16 hours in the atmosphere, and then, the structure of the junction between the copper wire and the electrode pad was analyzed using a transmission electron microscope (TEM).

Among the semiconductor devices of Examples 1 to 8, the junction surface between the copper wire and the electrode pad was formed of gold in the semiconductor devices of Examples 1 to 4, and the junction surface between the copper wire and the electrode pad was formed of copper in the semiconductor devices of Examples 5 to 8. In Examples 1 to 8, a CuAl alloy layer was not formed between the copper wire and electrode pad, and instead, an alloy of a metal which is less likely to be ionized than Al and Cu was formed, or the formation of an alloy layer was not observed. On the other hand, in the semiconductor devices in Comparative Examples 1 to 3, a CuAl alloy layer was formed between the copper wire and the aluminum electrode pad. The CuAl alloy layer forms an alloy layer such as $Cu_9Al_4$, which is easily corroded, and thus, there is a possibility of deterioration in reliability.

In addition, in Comparative Example 4, although the content of sulfur in the copper wire was lower than in other comparative examples, and the behavior was different from the behaviors of Comparative Examples 1 to 3, as a result, the reliability of the semiconductor device was more deteriorated than in Examples.

<Moisture Resistance and High Temperature Storage Properties>

An unsaturated moisture resistance test (HAST) and a high temperature storage test (HTSL) for a semiconductor device were performed on each of the semiconductor devices of Examples 1 to 8 and Comparative Examples 1 to 4. The results are shown in Table 2.

Specifically, HAST was conducted in accordance with IEC 68-2-66. The test conditions were 130° C. or 140° C., 85% RH, 20 V of applied voltage, and 96 hours. A defect occurrence number in ten packages was checked.

HTSL was conducted at 175° C. for 1000 hours and a defect occurrence number in ten packages was checked.

Ten prepared packages were used for defect determination in HAST and HTSL and the number of packages having a resistance value after the tests exceeding 1.2 times the initial resistance was counted.

As seen from Examples 1 to 8, the pads formed of the metal which is less likely to be ionized than Al using the copper wire having a density of sulfur of 19 ppm and a density of chlorine of 15 ppm exhibited excellent high temperature moisture resistance, and particularly, regarding high temperature properties, satisfactory results were obtained irrespective of the type of the epoxy resin composition for forming the encapsulant resin. The gold pad was particularly excellent in that the semiconductor device having excellent moisture resistance and high temperature storage properties was obtained even when the encapsulant resin was formed of the epoxy resin composition in which the density of Cl ions is equal to or more than 200 ppm.

This application claims priority on Japanese Patent Application No. 2012-068100, filed Mar. 23, 2012, the content of which is incorporated herein by reference.

The invention claimed is:

1. A semiconductor device comprising:
    a semiconductor element that is mounted on a substrate;
    an electrode pad that is provided in the semiconductor element;
    a copper wire that connects a connection terminal provided on the substrate and the electrode pad; and
    an encapsulant resin that encapsulates the semiconductor element and the copper wire,
    wherein a region of the electrode pad disposed within a range of equal to or less than 3 µm from a junction surface with the copper wire in a depth direction includes a metal, which is less likely to be ionized than aluminum, as a main component, and
    a content of sulfur in the copper wire is equal to or more than 15 ppm and equal to or less than 100 ppm with respect to a total amount of the copper wire.

TABLE 2

|  | Example 1 | Example 2 | Example 3 | Example 4 | Example 5 | Example 6 | Example 7 | Example 8 |
| --- | --- | --- | --- | --- | --- | --- | --- | --- |
| Pad | Au | Au | Au | Au | Cu | Cu | Cu | Cu |
| Encapsulant resin | Preparation Example 1 | Preparation Example 2 | Preparation Example 3 | Preparation Example 4 | Preparation Example 1 | Preparation Example 2 | Preparation Example 3 | Preparation Example 4 |
| HAST 130° C., 96 hr | 0 | 0 | 0 | 0 | 0 | 0 | 0 | 0 |
| HAST 140° C., 96 hr | 0 | 0 | 0 | 1 | 0 | 0 | 1 | 4 |
| HTSL 175° C., 1000 hr | 0 | 0 | 0 | 0 | 0 | 0 | 0 | 0 |

|  | Comparative Example 1 | Comparative Example 2 | Comparative Example 3 | Comparative Example 4 |
| --- | --- | --- | --- | --- |
| Pad | Al | Al | Al | Cu |
| Encapsulant resin | Preparation Example 2 | Preparation Example 3 | Preparation Example 4 | Preparation Example 4 |
| HAST 130° C., 96 hr | 2 | 4 | 10 | 0 |
| HAST 140° C., 96 hr | 10 | 10 | 10 | 2 |
| HTSL 175° C., 1000 hr | 0 | 2 | 10 | 6 |

2. The semiconductor device according to claim 1, wherein a content of chlorine in the copper wire is equal to or more than 5 ppm and equal to or less than 100 ppm with respect to the total amount of the copper wire.

3. The semiconductor device according to claim 1, wherein the electrode pad includes the metal, which is less likely to be ionized than aluminum, as a main component.

4. The semiconductor device according to claim 1, wherein the metal which is less likely to be ionized than aluminum is selected from a group consisting of nickel, gold, palladium, silver, copper, and platinum.

5. The semiconductor device according to claim 1, wherein the substrate is a lead frame or a circuit substrate.

* * * * *